United States Patent [19]

Johns

[11] Patent Number: 5,072,403
[45] Date of Patent: Dec. 10, 1991

[54] EQUIPMENT FOR AND METHODS OF LOCATING THE POSITION OF A FAULT ON A POWER TRANSMISSION LINE

[75] Inventor: Allan T. Johns, Swindon, England

[73] Assignee: Gec Alsthom Limited, England

[21] Appl. No.: 403,377

[22] Filed: Sep. 6, 1989

[30] Foreign Application Priority Data

Sep. 9, 1988 [GB] United Kingdom ............... 8821204

[51] Int. Cl.$^5$ ................. G06F 15/56; G01R 31/08
[52] U.S. Cl. ............................ 364/492; 324/522; 364/483
[58] Field of Search ............... 364/480, 481, 483, 492; 324/500, 509, 512, 522, 534

[56] References Cited

U.S. PATENT DOCUMENTS

| | | | |
|---|---|---|---|
| 4,107,778 | 8/1978 | Nii et al. | 364/492 |
| 4,352,137 | 9/1982 | Johns | 324/522 |
| 4,371,908 | 2/1983 | Andow et al. | 364/492 |
| 4,455,612 | 6/1984 | Girgis et al. | 364/492 |
| 4,559,491 | 12/1985 | Saha | 364/492 |
| 4,570,231 | 2/1986 | Bunch | 364/492 |
| 4,766,549 | 8/1988 | Schweitzer, III et al. | 324/522 |
| 4,795,983 | 1/1989 | Crockett et al. | 324/509 |
| 4,797,805 | 1/1989 | Nimmersjö364 | 492/ |
| 4,812,995 | 3/1989 | Girgis et al. | 324/512 |
| 4,857,854 | 8/1989 | Matsushima | 324/512 |
| 4,897,607 | 1/1990 | Grünewald et al. | 324/512 |

FOREIGN PATENT DOCUMENTS

| | | |
|---|---|---|
| 0226210 | 6/1987 | European Pat. Off. . |
| 0230801 | 8/1987 | European Pat. Off. . |
| 0239268 | 9/1987 | European Pat. Off. . |
| 52-154053 | 12/1977 | Japan . |

OTHER PUBLICATIONS

E. O. Schweitzer, "Evaluation and Development of Transmission Line Fault Locating Techniques Which Use Sinusoidal Steady-State Information", Computers and Electrical Engineering, U.S.A., 10, (4), 1983, pp. 269–278.

Le, H. H., Nguyen, C. T.: "System for Location and Analysis of Faults in High Voltage Transmission Lines", Bull. Sci. Assoc. Ing. Electr. Inst. Electrotech. Montegiore, 1981, 94, 4, pp. 129–134.

IEE Trans. on Power Apparatus and Systems, vol. PAS-101, Nos. 8/9, Aug.-Sep. 1982, pp. 2892–2898, IEEE, New York, U.S.; T. Takagi et al, "Development of a New Type Fault Locator Using the One-Terminal Voltage and Current Data".

Patent Abstracts of Japan, vol. 12, No. 125 (P-691), (2972), Apr. 19, 1988, JP-A-62249078 (Chubu Electric Power): 30-10-1987.

*Primary Examiner*—Kevin J. Teska
*Attorney, Agent, or Firm*—Kirschstein, Ottinger, Israel & Schiffmiller

[57] ABSTRACT

An equipment for locating the position of a fault (9) on a power transmission line (7) between two ends (11,13) of the line (7) comprising: a voltage (15A,B) and a current (17A,B) sensor located at each end (11,13) of the line (7) for deriving signals representative of the voltage $V_S, V_R$ and current $I_S, I_R$ at each end (11,13); and two interlinked microprocessors (21A,B), one located at each end (11,13) of the line (7), for calculating the distance x of the fault (9) from one end of the line (11) utilizing the signals and equations of the form:

$$V_f = V_S \cosh(Tx) - I_S Z_O \sinh(Tx);$$

and $$V_f = V_R \cosh(T(L-x)) - I_R Z_O \sinh(T(L-x)),$$

where $V_f$ is the fault voltage, T is the propagation constant of the line (7), $Z_O$ is the characteristic impedance of the line (7) and L is the total length of the line (7).

5 Claims, 3 Drawing Sheets

EQUIPMENT FOR AND METHODS OF LOCATING THE POSITION OF A FAULT ON A POWER TRANSMISSION LINE

BACKGROUND OF THE INVENTION

1. Field of the Invention

This invention relates to equipment for and methods of locating the position of a fault on a power transmission line.

2. Description of Related Art

Satisfactory operation of known forms of such equipment, for example those using impedance to fault measuring techniques or adaptations thereof, relies on one or more of a number of assumptions which make them inaccurate in certain circumstances. The main assumptions made are as follows: that the transmission line conductors are ideally transposed; that the parameters of the network in which the transmission line is connected are known and constant; that the fault type can be determined; that shunt capacitance of the line can be neglected; and that the phase of the current in the fault path can be determined.

SUMMARY OF THE INVENTION

It is an object of the present invention to provide an equipment for and method of locating the position of a fault on a power transmission line whose operation does not depend on any of the above assumptions.

According to a first aspect of the present invention there is provided an equipment for locating the position of a fault on a power tranmission line between a first and a second end of said line comprising: first means for deriving first and second signals representative respectively of the voltage $V_S$ and current $I_S$ at said first end; second means for deriving third and fourth signals representative respectively of the voltage $V_R$ and current $I_R$ at said second end; and means for calculating the position of the fault utilising said first, second, third and fourth signals and equations of the form:

$$X_f = A_S V_S - B_S I_S,$$

and $$X_f = A_R V_R - B_R I_R,$$

where $X_f$ is the fault voltage or current, $A_S$ is a first transmission parameter of the line between the fault and said first end, $B_S$ is a second transmission parameter of the line between the fault and said first end, $A_R$ is a first transmission parameter of the line between the fault and said second end, and $B_R$ is a second transmission parameter of the line between the fault and said second end.

In one particular equipment according to the invention where said power transmission line is a multi-phase power transmission line; said first and second means derive a set of said first, second, third and fourth signals in respect of each phase of said transmission line; and said means for calculating includes means for transforming said signals to produce corresponding sets of decoupled signals $V_{Sn}$, $I_{Sn}$, $V_{Rn}$, $I_{Rn}$ and means for utilising each set of said decoupled signals in equations of the form:

$$X_{fn} = A_{Sn} V_{Sn} - B_{Sn} I_{Sn},$$

and $$X_{fn} = A_{Rn} V_{Rn} - B_{Rn} I_{Rn},$$

where n indicates the relevant said set.

According to a second aspect of the present invention there is provided a method of locating the position of a fault on a power transmission line between a first and a second end of said line comprising the steps of: deriving first and second signals representative respectively of the voltage $V_S$ and current $I_S$ at said first end; deriving third and fourth signals representative respectively of the voltage $V_R$ and current $I_R$ at said second end; and calculating the position of the fault utilising said first, second, third and fourth signals and equations of the form:

$$X_f = A_S V_S - B_S I_S,$$

and $$X_f = A_R V_R - B_R I_R,$$

where $X_f$ is the fault voltage or current, $A_S$ is a first transmission parameter of the line between the fault and said first end, $B_S$ is a second transmission parameter of the line between the fault and said first end, $A_R$ is a first transmission parameter of the line between the fault and said second end, and $B_R$ is a second transmission parameter of the line between the fault and said second end. In one particular method according to the invention where said power transmission line is a multi-phase power transmission line; the steps of deriving said first, second, third and fourth signals comprise deriving a set of said first, second, third and fourth signals in respect of each phase of said transmission line; and the step of calculating includes transforming said signals to produce corresponding sets of decoupled signals $V_{Sn}$, $I_{Sn}$, $V_{Rn}$, $I_{Rn}$ and utilising each set of said decoupled signals in equations of the form:

$$X_{fn} = A_{Sn} V_{Sn} - B_{Sn} I_{Sn},$$

and $$X_{fn} = A_{Rn} V_{Rn} - B_{Rn} I_{Rn},$$

where n indicates the relevant set.

BRIEF DESCRIPTION OF THE DRAWINGS

The invention will now be further explained and, one equipment for and method of locating the position of a fault on a power transmission line in accordance with the invention is described by way of example, with reference to the accompanying drawings in which.

DETAILED DESCRIPTION OF THE PREFERRED EMBODIMENTS

Figure 1:
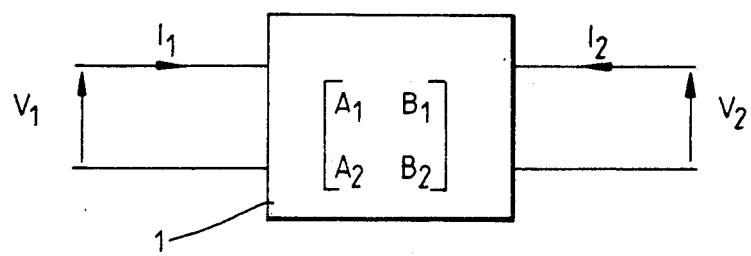
FIG. 1 is a diagram illustrating a two port network.

The invention makes use of the well known two port network equation. The two port network equation relates the voltage and current at one port of a two port network to the voltage and current at the other port, as follows:

$$\begin{bmatrix} V_1 \\ I_1 \end{bmatrix} = \begin{bmatrix} A_1 B_1 \\ A_2 B_2 \end{bmatrix} \begin{bmatrix} V_2 \\ I_2 \end{bmatrix}, \quad (1)$$

where, as illustrated in FIG. 1, $V_1$ and $I_1$ are the voltage and current respectively at one port of a two port network 1, $V_2$ and $I_2$ are the voltage and current respectively at the other port of the two port network 1, and $A_1$, $A_2$, $B_1$ and $B_2$ are the parameters, i.e. transfer functions, of the two port network 1. Multiplying out the matricies of equation (1) gives:

$$V_1 = A_1 V_2 + B_1 I_2 \quad (2)$$

and $$I_1 = A_2 V_2 + B_2 I_2 \quad (3).$$

Figure 2:
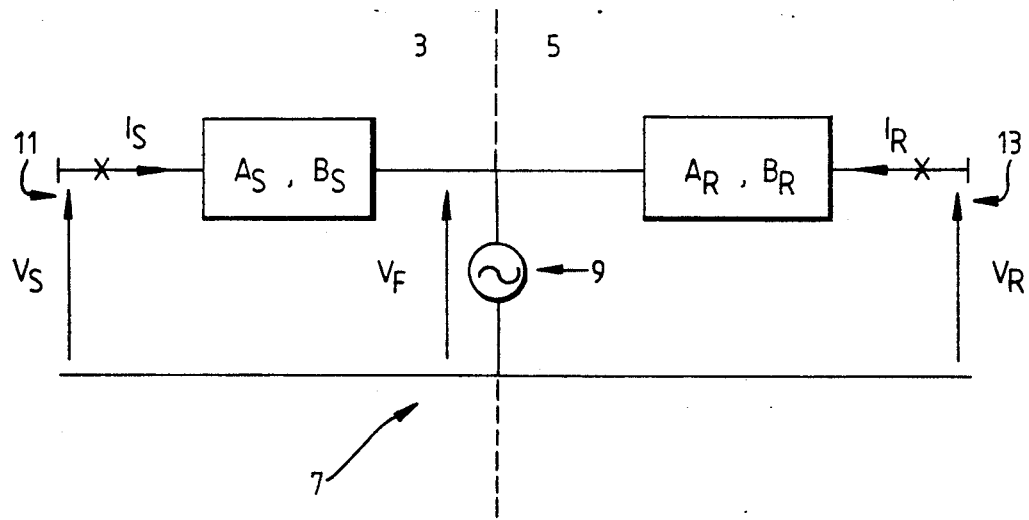
FIG. 2 is a schematic diagram of a power transmission line having a fault.

The invention resides in the application of the two port network equation to the or each phase of a power transmission line having a fault in respect of the parts of the line on either side of the fault. Thus, referring to FIG. 2, application of equation (2) to parts 3 and 5 of a power transmission line 7 on either side of a fault 9 produces an equation:

$$V_f = A_S V_S - B_S I_S \quad (4)$$

for part 3, and produces an equation:

$$V_f = A_R V_R - B_R I_R \quad (5)$$

for part 5; where: $V_f$ is the fault voltage; $V_S$ and $I_S$ are the voltage and current respectively at the end 11 of the part 3 of the transmission line 7 remote from the fault 9; $V_R$ and $I_R$ are the voltage and current respectively at the end 13 of the part 5 of the transmission line 7 remote from the fault 9; $A_S$ and $B_S$ are first and second transmission line parameters between the fault 9 and the end 11; and $A_R$ and $B_R$ are first and second transmission line parameters between the fault 9 and the second end 13. From transmission line theory:

$$\left.\begin{array}{l} A_S = \cosh(Tx) \\ B_S = Z_0 \sinh(Tx) \\ A_R = \cosh(T(L-x)) \\ B_R = Z_0 \sinh(T(L-x)) \end{array}\right\} \quad (6)$$

where T is the propagation constant of the line 7, x is the distance of the fault 9 along the transmission line 7 from the end 11, $Z_O$ is the characteristic impedance of the line 7 and L is the total length of the line 7 between the ends 11 and 13.

Equating the right-hand sides of equations (4) and (5) and substituting for $A_S$, $B_S$, $A_R$ and $B_R$ from equations (6) gives:

$$V_S \cos h(Tx) - I_S Z_O \sin h(Tx) = V_R \cos h(T(L-x)) - I_R Z_O \sin h(T(L-x))$$

Expanding $\cos h(T(L-x))$ and $\sin h(T(L-x))$ gives:

$$V_S \cosh(Tx) - I_S Z_0 \sinh(Tx) =$$
$$V_R (\cosh(TL)\cosh(Tx) - \sinh(TL)\sinh(Tx)) -$$
$$I_R Z_0 (\sinh(TL)\cosh(Tx) - \cosh(TL)\sinh(Tx)).$$

Rearranging gives:
$$-\cos h(Tx)*(V_R \cos h(TL) - I_R Z_O \sin h(TL) - V_S) = \sin h(Tx)*(I_R Z_O \cos h(TL) - V_R \sin h(TL) + I_S Z_O)$$

Therefore:

$$\tanh(Tx) = \frac{-(V_R \cosh(TL) - I_R Z_0 \sinh(TL) - V_S)}{I_R Z_0 \cosh(TL) - V_R \sinh(TL) + I_S Z_0}$$

Therefore:

$$x = \frac{\tanh^{-1}(-Q/P)}{T}, \quad (7)$$

where:
$$P = I_R Z_O \cos h(TL) - V_R \sin h(TL) + I_S Z_O$$

and:

$$Q = V_R \cos h(TL) - I_R Z_O \sin h(TL) - V_S$$

Hence, if the values of $V_S$, $I_S$, $V_R$, $I_R$, $Z_O$, T and L are known, the distance x of the fault 9 along the transmission line 7 from the end 11 can be calculated from equations (7), (8) and (9). $V_S$, $I_S$, $V_R$ and $I_R$ can be measured at each end of the line and $Z_O$, T and L will be known for a given transmission line.

It is to be noted that equations (7), (8) and (9) hold irrespective of the type of the fault 9 and are indeterminate for a fault free healthy line. Furthermore, equations (7), (8) and (9) are independent of the fault path which may therefore be non-linear and still not affect the calculation of x. T and $Z_O$ cater for the non-transposition and shunt capacitance of the line and are not affected by the parameters of the network in which the transmission line is connected.

Figure 3:
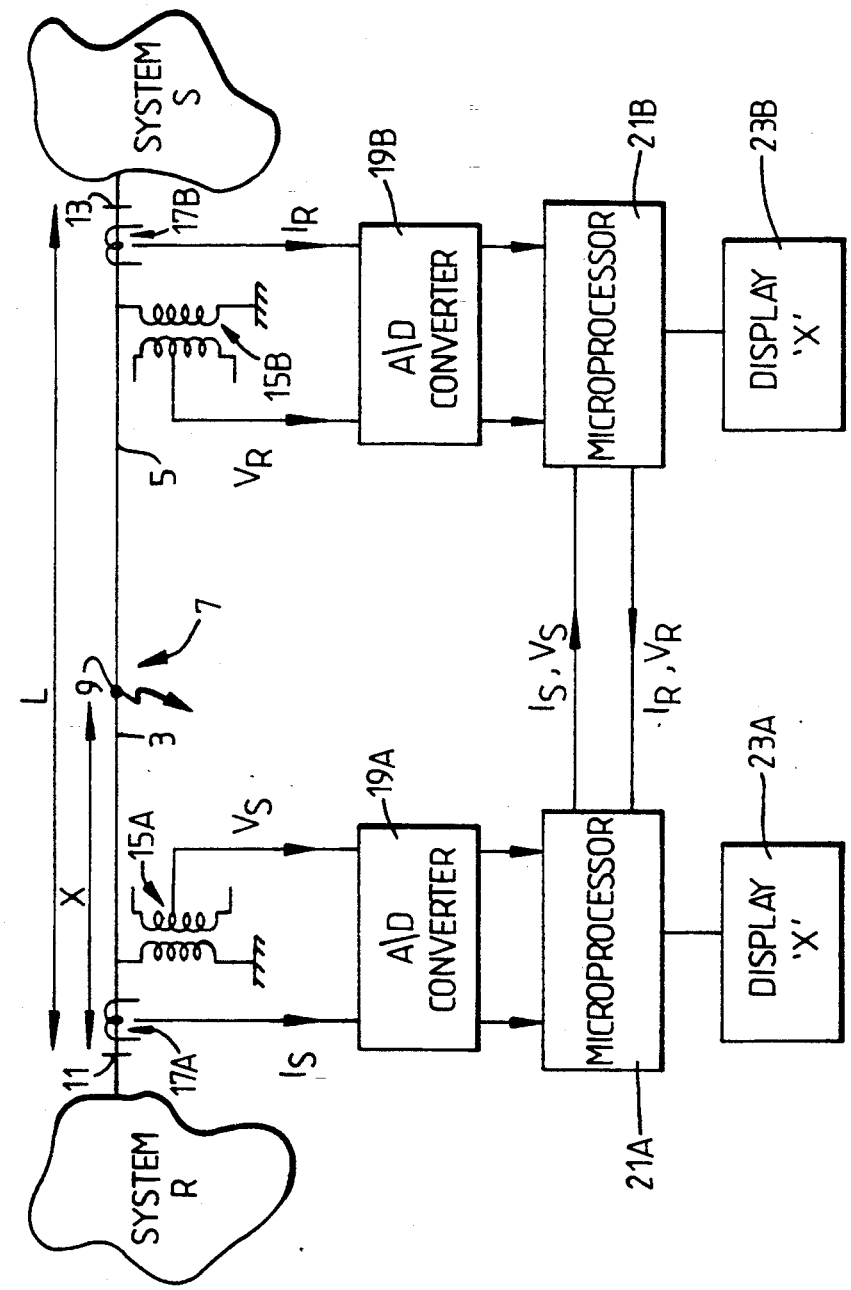
FIG. 3 is a schematic diagram of the equipment.

One example of an equipment for carrying out the method according to the invention will now be described with reference to FIG. 3.

The equipment comprises, at each of the two ends 11 and 13 of the line 7, a voltage sensor 15A or 15B and current sensor 17A or 17B, for measuring the voltage $V_S$ or $V_R$ and current $I_S$ or $I_R$ at that end 11 or 13 of the line 7, an analogue to digital (A/D) converter 19A or 19B for converting the analogue signals output by the voltage and current sensors 15A, 17A or 15B, 17B into digital form, a microprocessor 21A or 21B which receives these digital signals and a display 23A or 23B. The line 7 is shown as interconnecting two power transmission systems R and S. The microprocessors 21A and 21B are interconnected so that each microprocesor 21A or 21B receives not only the digital voltage and current signals from the end at which it is situated, but also the digital voltage and current signals from the other end of the line 7. Each microprocessor 21A or 21B can therefore calculate x as defined by equations (7), (8) and (9) using the values of $V_S$, $I_S$, $V_R$ and $I_R$ input to it and the known values of $Z_O$, T and L. The value of x is displayed on each of the displays 23.

Where the line 7 is a multiphase transmission line, the calculations are performed in respect of each phase of the transmitted power. However, in the case of a multiphase line the problem arises that the different phases will normally not be decoupled.

To overcome this problem a modal component transformation may be used, as described in an article by L. M. Wedephol entitled 'Application of matrix methods to the solution of travelling wave phenomena in polyphase systems' published in 1968 in Proc IEE 110 (12) at pages 2200 to 2212.

To this end the microprocessors 21A and 21B are arranged to multiply the voltage and current quantities $V_S$, $I_S$ or $V_R$, $I_R$ for each phase by an appropriate transformation matrix to produce corresponding sets of decoupled quantities $V_{Sn}$, $I_{Sn}$ or $V_{Rn}$, $I_{Rn}$ where n is 1, 2 etc. up to the number of phases in the system. These decoupled quantities are then utilised in respect of each phase of the line 7 in equations of the form:

$$V_{fn} = A_{Sn} V_{Sn} - B_{Sn} I_{Sn} \tag{10}$$

and $$V_{fn} = A_{Rn} V_{Rn} - B_{Rn} I_{Rn} \tag{11},$$

where $A_{Sn}$, $B_{Sn}$, $A_{Rn}$ and $B_{Rn}$ are the model line parameters and $$\left. \begin{array}{rcl} A_{Sn} & = & \cosh(T_n x) \\ B_{Sn} & = & Z_{0n} \sinh(T_n x) \\ A_{Rn} & = & \cosh(T_n(L-x)) \\ B_{Rn} & = & Z_{0n} \sinh(T_n(L-x)) \end{array} \right\} \tag{12}$$

where $T_n$ are the modal propagation constants of the line and $Z_{0n}$ are the characteristic modal impedances of the line. Equations (10), (11) and (12) are then worked in the same way as equations (4), (5) and (6) above to obtain the distance x of the fault along the line 7 from the end 11, as in equations (7), (8) and (9) above; that is:

$$x = \frac{\tanh^{-1}(-Q_n/P_n)}{T_n}, \tag{13}$$

where:

$$P_n = I_{Rn} Z_{0n} \cos h(T_n L) - V_{Rn} \sin h(T_n L) + I_{Sn} Z_{0n} \tag{14}$$

and $$Q_n = V_{Rn} \cos h(T_n L) - I_{Rn} Z_{0n} \sin h(T_n L) - V_{Sn} \tag{15}.$$

Figure 4:
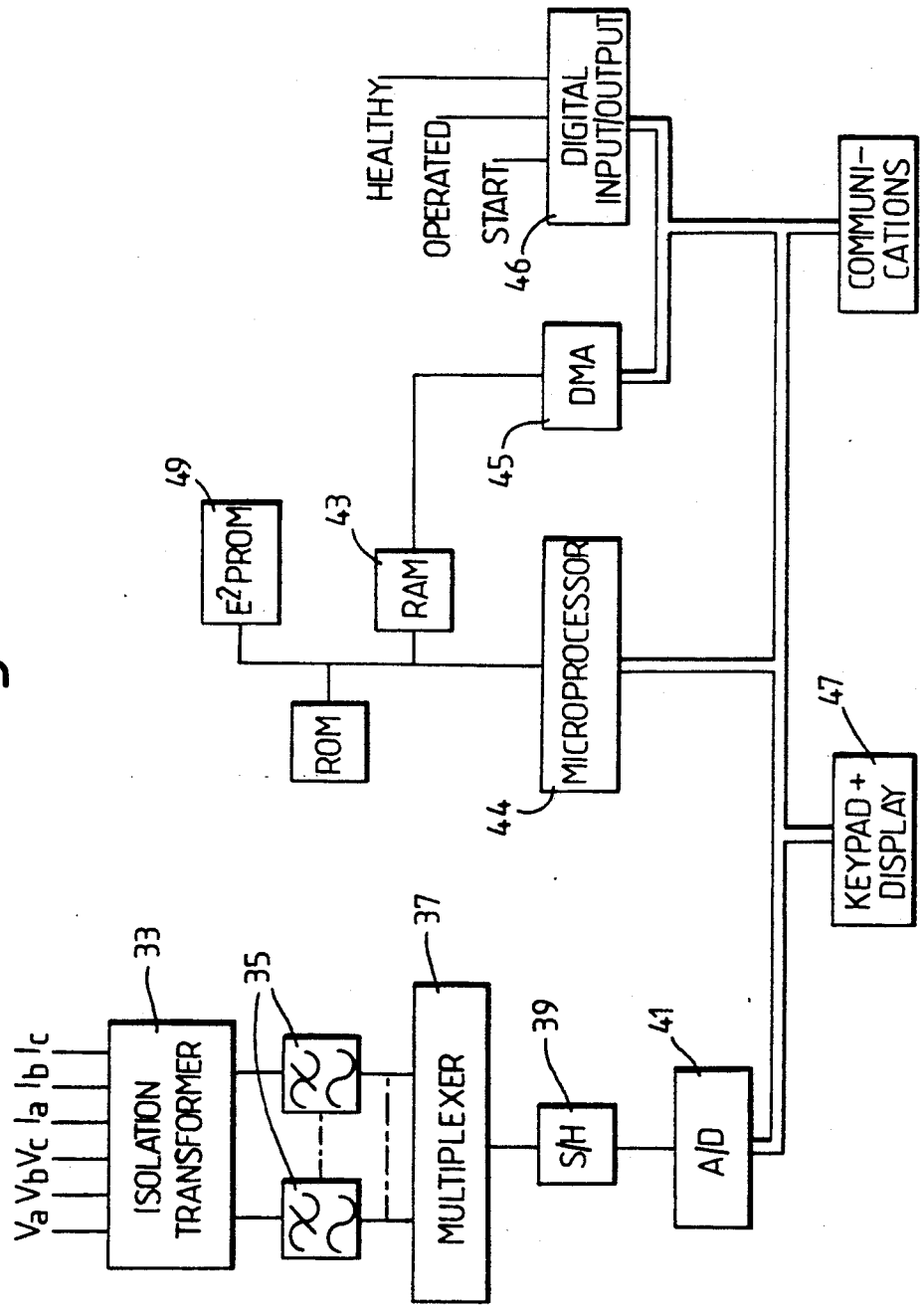
FIG. 4 is a block schematic diagram showing the part of the equipment at one end of the transmission line in greater detail.

One particular form of the equipment at each end of the line 7 will now be described in greater detail with reference to FIG. 4. The equipment is for use with a three-phase transmission line. The three phase voltage and current signals $V_a$, $V_b$, $V_c$, $I_a$, $I_b$ and $I_c$ from line transformers (not shown) are fed, via an isolation transformer 33 and filters 35 for extracting the power frequency phase information, to a multiplexer 37. The output of the multiplexer 37 is then passed via a sample and hold gate 39 to an A/D converter 41. The resultant digitised signals are stored in a cyclic buffer in a random access memory 43 of a microprocessor 44 by a direct memory access unit 45. An input/output unit 46 is sampled continuously until a start signal indicating occurrence of fault is received from a line protection equipment, typically a distance relay, after which the process of sampling the phase voltage and current signals $V_a$, $V_b$, $V_c$, $I_a$, $I_b$, $I_c$ continues until post fault data has been captured. The microprocessor 44 then carries out the necessary calculations. A keypad and alpha numeric display 47 are used to display and transfer the modal voltages and currents, to display the final distance to fault result calculated by the microprocessor and to enter the line parameters for storage in an electrically erasable programmable read only memory 49.

It will be understood that if the line 7 is a multi-circuit line there will be a set of modal components for each phase and each circuit. Thus for a single circuit three-phase line n will have values 1, 2 and 3 and for a double circuit three-phase line will have values 1 to 6.

It will be further understood that transformations other than a modal component transformation may be used for decoupling purposes in equipment and methods according to the invention. For example, the well known symmetrical component transformation might be used, for example, if the transmission line conductors were known to be ideally transposed.

It is also pointed out that whilst in the above explanation of the invention and in the equipment and method described by way of example, use of the voltage equation (2) is described, the current equation (3) could equally well be used.

I claim:

1. A power transmission system comprising a power transmission line and an equipment for locating a position of a fault on a section of said power transmission line between a first and a second end of said line section, said equipment comprising: line protection equipment for providing a start signal indicative of the occurrence of a said fault; first means responsive to said start signal for deriving first and second digital signals representative respectively of a post fault voltage $V_S$ and a post fault current $I_S$ at said first end, said first means including a first voltage sensor and a first current sensor for producing analog signals representative respectively of the voltage $V_S$ and the current $I_S$ and a first analog to digital converter for converting the analog signals provided by said first voltage and current sensors to said first and second digital signals respectively; second means also responsive to said start signal for deriving third and fourth digital signals representative respectively of a post fault voltage $V_R$ and a post fault current $I_R$ at said second end, said second means including a second voltage sensor and a second current sensor for producing analog signals representative respectively of the voltage $V_R$ and the current $I_R$ and a second analog to digital converter for converting the analog signals provided by said second voltage and current sensors to said third and fourth digital signals respectively; processor means responsive to said first, second, third and fourth signals for calculating the distance of the fault from a said end of said line section utilizing equations of the form:

$$X_f = A_S V_S - B_S I_S,$$

and $$X_f = A_R V_R - B_R I_R,$$

where $X_f$ is the fault voltage or current, $A_S$ is a first transmission parameter of the line section between the fault and said first end, $B_S$ is a second transmission parameter of the line section between the fault and said first end, $A_R$ is a first transmission parameter of the line section between the fault and said second end, and $B_R$ is a second transmission parameter of the line section between the fault and said second end, said processor means including a random access memory in which said first to fourth digital signals are stored and a read only memory in which said transmission parameters of the line section are stored, said first and second means each including an isolation device for isolating said processor means from the high voltages of said power transmission lines; and display means for displaying said distance.

2. A system according to claim 1, wherein: $X_f$ is the voltage at the fault; $A_S = \cos h\ (Tx)$; $B_S = Z_O \sin h\ (Tx)$; $A_R = \cos h\ (T(L-x))$ and $B_R = Z_O \sin h\ (T(L-x))$, where T is the propagation constant of said line section, x is the distance of the fault along the transmission line section from said first end, $Z_O$ is the characteristic impedance of said line section and L is the total length of the line section between said first and second ends.

3. A system according to claim 1, wherein said processor means comprises a microprocessor.

4. A system according to claim 1, wherein: said power transmission line section is a multi-phase power transmission line section; said first and second means derive a set of said first, second, third and fourth signals in respect of each phase of said transmission line section; and said processor means includes firstly means for transforming said signals to produce corresponding sets of decoupled signals $V_{Sn}$, $I_{Sn}$, $V_{Rn}$, $I_{Rn}$ and secondly means for utilizing each set of said decoupled signals and equations of the form:

$$X_{fn} = A_{Sn} V_{Sn} - B_{Sn} I_{Sn};$$

and $$X_{fn} = A_{Rn} V_{Rn} - R_{Bn} I_{Rn},$$

where n indicates the relevant said set.

5. A system according to claim 4, wherein the transformation applied by said means for transforming is a modal component transformation.

* * * * *